(12) United States Patent
Milanov

(10) Patent No.: US 12,347,745 B2
(45) Date of Patent: Jul. 1, 2025

(54) NANOELECTRIC SYSTEM FOR COOLING PROCESSORS AND RAM MEMORIES

(71) Applicants: Emil Stefanov Milanov, Sofia (BG);
Ivan Ignatov Michaylov, Sofia (BG);
Valeri Todorov Hammer, Sofia (BG)

(72) Inventor: Emil Stefanov Milanov, Sofia (BG)

(*) Notice: Subject to any disclaimer, the term of this patent is extended or adjusted under 35 U.S.C. 154(b) by 0 days.

(21) Appl. No.: 18/843,295

(22) PCT Filed: Jun. 17, 2022

(86) PCT No.: PCT/BG2022/000008
§ 371 (c)(1),
(2) Date: Sep. 2, 2024

(87) PCT Pub. No.: WO2023/205862
PCT Pub. Date: Nov. 2, 2023

(65) Prior Publication Data
US 2025/0112117 A1    Apr. 3, 2025

(30) Foreign Application Priority Data

Apr. 29, 2022   (BG) .......................................... 113528

(51) Int. Cl.
*H01L 23/38*      (2006.01)
(52) U.S. Cl.
CPC .................................... *H01L 23/38* (2013.01)
(58) Field of Classification Search
CPC ...................................................... H01L 23/38
(Continued)

(56) References Cited

U.S. PATENT DOCUMENTS 6,598,666 B2      7/2003   Lin
2009/0308081 A1*  12/2009  Ouyang .................. H01L 23/38
                                                              62/3.2

(Continued)

FOREIGN PATENT DOCUMENTS

BG              113245 A      4/2022
WO         20010090866 A2    11/2001

OTHER PUBLICATIONS

"Optical 'rectenna' converts light to direct current," Sep. 28, 2015, retrieved from optics.org/news/6/9/42.

(Continued)

*Primary Examiner* — Sheng-Bai Zhu
(74) *Attorney, Agent, or Firm* — CrossPond Law

(57) ABSTRACT

A nanoelectronic system for cooling processors and RAM memories comprises two cooling chips, located at a distance between 20 nanometres and 200 nanometres relative to both wide-area surfaces of a processor or RAM chip (2), whereby the spaces between the individual chips (1*a*), (1*b*) and (2) are two vacuum slots (3*a*), (3*b*), and the distance between the chips is maintained by point columns (4.1 . . . 4.*k*, 4.*k*+1 . . . 4.*n*), which are made using a photolithography technique with the minimum size allowable for the technology—between 5 nm and 10 nm, and are moulded on the surfaces of both cooling chips (1*a*), (1*b*), whereby the whole system of chips (1*a*), (1*b*) and (2) thus described is hermetically encapsulated by a common outer housing (5); the cooling chips (1*a*) and (1*b*) comprise on their surface areas facing the main functional chip (2)—respectively, arrays of rectenna photodetectors (6*a*) and (6*b*) of infrared emission.

3 Claims, 4 Drawing Sheets

(58) Field of Classification Search
USPC .......................................................... 257/712
See application file for complete search history.

(56) References Cited

U.S. PATENT DOCUMENTS

| | | | | |
|---|---|---|---|---|
| 2012/0076162 | A1* | 3/2012 | Girlando | H02S 99/00 372/36 |
| 2012/0133216 | A1* | 5/2012 | Amma | H02J 50/40 307/104 |
| 2014/0373535 | A1* | 12/2014 | Moddel | F03G 6/001 60/641.1 |
| 2016/0094091 | A1* | 3/2016 | Shin | H01Q 1/248 307/104 |
| 2016/0350182 | A1* | 12/2016 | Tsutsui | H10D 86/60 |
| 2018/0116076 | A1* | 4/2018 | Dede | H01L 23/473 |
| 2019/0280690 | A1* | 9/2019 | Mahler | H03K 17/9537 |
| 2023/0343688 | A1* | 10/2023 | Barkow | H01L 23/367 |

OTHER PUBLICATIONS

Joulain, Karl et. al., "Surface Electromagnetic Waves Thermally Excited: Radiative Heat Transfer, Coherence Properties and Casimir Forces Revisited in the Near Field," Surface Science Reports, vol. 57, Issues 3-4, May 2005, pp. 59-112; https://doi.org/10.1016/j.surfrep.2004.12.002.
PCT/BG2022/000008, International Search Report, Oct. 18, 2022.
PCT/BG2022/000008, Written Opinion of the ISA, Jan. 12, 2023.
Mitrovic, Ivona Z. et. al., "Oxides for Rectenna Technology," Materials 14, No. 18: 5218, Sep. 10, 2021, https://doi.org/10.3390/ma14185218.
Mittapally, R. et al., "Near-field thermophotovoltaics for efficient heat to electricity conversion at high power density," Nat Commun 12, 4364, Jul. 16, 2021, https://doi.org/10.1038/s41467-021-24587-7.

* cited by examiner

NANOELECTRIC SYSTEM FOR COOLING PROCESSORS AND RAM MEMORIES

FIELD OF THE INVENTION

The invention relates to a nanoelectronic system for cooling processors and RAM memories. Such a system comprises dedicated chips, which are manufactured by means of a nanotechnological process and are located in a common housing with the processor or the RAM chip. In addition to the cooling function, these chips will be able to recover some of the thermal energy released by the computer chip, returning it in the form of electrical power so as to power the base chip with which they are integrated into a common arrangement; this is a qualitatively different function according to the invention of the cooling system, different from the cooling means used so far for microprocessors, mobile devices, servers, data centres, desktop computers, cryptocurrency farms, GPUs, etc.

BACKGROUND OF THE INVENTION

Known systems for cooling electronic chips use a heat exchange mechanism, wherein the heated chip body is in direct thermal contact with a heat sink. In addition, a working element of the heat sink is air or liquid (water) flowing in the cooling system. The purpose of the cooling system is to reduce the thermal resistance in the processes of heat exchange with the external environment and, hence, to reduce the operating temperature of the processor or RAM memory at a given heat dissipation. The use of an efficient cooling system allows for the possibility of higher operating frequencies and speeds of the processor or the memory and fewer statistical errors during operations.

In a few cases, as in one patent /1/, an active cooling system with a thermocouple is used, but it is associated with additional electrical power consumption by the thermocouple.

Usually, the processor is soldered directly to the motherboard of a computer, or to the PCB of a mobile device. This is associated with an increased thermal resistance of the heat flux flowing from the heated chip in the processor housing towards the PCB, and only the top surface of the chip is actually cooled by the cooling device. In one patent /2/ this problem is partially overcome by a special cooling arrangement. However, a disadvantage of the technical solution described in this patent is the bulky cooling design, whereby the processor is mounted on a special separate PCB inside the cooling device.

In addition to the heat exchange in a direct thermal contact of a heated body with the environment, there is also a process of infrared electromagnetic emission from the heated body into the environment. In the existing technical cooling systems, these processes of infrared electromagnetic emission from the heated chips are considered negligible in terms of power dissipation and energy flux compared to the thermodynamic processes of direct thermal contact that take place in these systems. However, as can be seen from a scientific publication /3/ on the near electromagnetic chaotic field that arises near the surface of a heated solid body, its intensity can increase e.g. by about three orders of the magnitude at distances of about 100 nanometres from the heated surface of the solid body. This is illustrated by graphs for different materials (FIG. 4) taken from the same scientific publication. A feature of the near electromagnetic field that arises near the surface of a solid body is also that it has a narrower emission spectrum than in the far region. It also has properties of partial coherence, and it is assumed that there are components of electromagnetic waves in the infrared spectral region, which propagate parallel to the surface of the heated solid body. This is due to the fact that quasiparticles, such as plasmon polaritons in a metal and a semiconductor or phonon polaritons in a dielectric, also theoretically are a source of the near electromagnetic field. These propagate as surface waves at the phase boundary of the solid body /3/. An idea arises of using a tuned array of selective rectenna resonator-absorbers of radiant electromagnetic energy to achieve efficient reception of energy from the narrower spectral regions of infrared emission, which appears as a collective effect of the near chaotic electromagnetic field in solid bodies. Such emission intensity can exceed many times the background thermal emission from a surface of the heated solid body at a given temperature, which can be measured in the remote regions over one wavelength. It is to be noted that such processes can also take place in a vacuum. The efficiency of rectenna receivers of infrared emission and the conversion thereof into electric current can theoretically reach more than 80% compared to about 30-35%, which is the maximum for photovoltaic cells based on semiconductor heterojunctions and, for comparison, only about 10% for contact thermocouples or thermocouples.

In a patent application /4/, energy from the near chaotic electromagnetic field arising near the surface of a solid body is recovered by chip arrangements comprising dedicated arrays of rectenna receivers of infrared emission. As a separate chip of this type, the patent application /4/ claims that it can be used as a power supply for bioimplants. In the same patent application, a system of such chips is also disclosed as an essential part of a power plant for spacecrafts, wherein the power source is a nuclear reactor and the propulsion system thereof is an ionic or plasma engine. For these, the dedicated system consisting of rectenna chips is a converter transforming the thermal energy released by the nuclear reactor into electrical power and, at the same time, it is a new type of efficient cooling means for spacecrafts of this type. A critical problem for such aircrafts is the release of residual heat from the nuclear reactor in the form of infrared emission into the vacuum of space, and this problem is largely solved by the use of rectenna converters transforming the thermal energy into electrical power. A disadvantage of the technical solutions disclosed in said patent is that they do not address the possibility of using chips with rectenna arrays for other types of cooling that are applicable to mass-produced equipment, such as computer equipment and mobile devices. Another disadvantage of the patent /4/ is that the patent discloses two specific private cases of arrangements of rectenna receivers of near-infrared field emissions, and does not fully clarify the concept of specialized receivers in the near electromagnetic field in the general case thereof—as a general description of all possible arrangements of such rectenna infrared photoreceivers.

SUMMARY OF THE INVENTION

According to the invention, a nanoelectronic cooling system comprises two cooling chips, which are located at a distance between 20 nanometres and 200 nanometres relative to both wide-area surfaces of a processor or RAM chip. The spaces between the individual chips are two vacuum slots, and the distance between the chips is maintained by point columns, which are made using a photolithographic technique with the minimum size allowable for the technology of between 5 nm and 10 nm and are moulded on the surfaces of both cooling chips. The whole system of chips thus described is hermetically encapsulated by a common outer housing. The cooling chips, on the other hand, comprise on their surfaces areas facing the main functional chip arrays of rectenna photodetectors of infrared emission. Also, one of the two cooling chips has an integrated circuit on its surface for power management of the supply current flowing to the base functional chip.

In the system described above, partial conversion of the thermal energy released from both wide-area surfaces of the processor, or the RAM memory, into electrical power is accomplished by both cooling chips, which are arranged in a common housing with the base integrated circuit being cooled.

An advantage is the maximum compactness and minimal volume of the cooling system arrangement in a common housing, which is common to the three chips.

Another advantage is that cooling is carried-out with equal efficiency both from the top surface of the cooled chip housing and from the bottom surface of the chip housing, where the feet for soldering the chip to the base PCB are located.

The choice of creating arrays of rectenna photodetectors of infrared emission above the surfaces of both cooling chips facing the base chip creates the potential possibility for conversion of over 80% of the thermal energy released under operating conditions from the base chip into electrical power. This is further facilitated by the high intensity of the near chaotic electromagnetic field, which is expected to be over 1000 times more intense in the vacuum slots of the arrangement and to have dimensions in the order of 100 nm, as well as by the special rectenna arrangement disclosed in the patent. The minimum contact areas of the point columns supporting the whole arrangement contribute to a high conversion rate of the thermal energy into electrical power. They can be between 5 nm to 10 nm in size and are moulded on the surfaces of both cooling chips. The vacuum maintained inside the common housing for the three chips also contributes to a high conversion rate of the thermal energy into electrical power. All this creates minimum thermal contact of the heated processor chip or the RAM memory with the outer housing of the three-chip system, whereby cooling of the base chip is carried-out mainly by the emission mechanism of thermal energy output through the energy of the near chaotic electromagnetic field, which can be recovered into electrical power by the rectenna arrays in the system. The thermal energy recovered from the cooling chips is fed back through the integrated power management circuit of the supply current flowing to the base functional chip. It can be used to power the processor chip, or the RAM memory.

A major advantage of the invention is the reduction of power consumption in mass electronics—two to three times less power supply will be needed for powering the microprocessors at the same operating parameters, and also for mobile devices, servers, data centres, desktop computers, cryptocurrency farms, GPUs, etc.

Another advantage is that the invention is also able to radically extend the operating time of a mobile device with one charge of its battery and using the same battery over and over again.

An important advantage is also that, due to the fact that the cooling chips and the cooled chip are arranged inside a common integrated circuit housing, any other cooling system for computer or mobile equipment applied so far is applicable. This means that the cooling quality of the base chip can be further improved, the operating temperature thereof can be reduced, and the operating frequency and allowable power dissipation can also be increased.

In a preferred embodiment of the invention, the arrays of rectenna photodetectors of infrared emission comprise rectennas with special arrangement. One rectenna of these arrays has both an antenna arrangement for receiving infrared emission with emission polarization in the plane of the chip and with a uniform reception diagram along both axes x, y in the plane, and at least one nanoantenna blade or such an antenna system of a plurality of nano blades, which is arranged in the vacuum slot for receiving infrared emission along the z-axis from the gradient chaotic electromagnetic field, which propagates in the form of surface electromagnetic waves in the relevant vacuum slot. Also, the volume of the respective cooling chip comprises a resonant chamber formed technologically, which geometry is setup at the maximum value in the spectrum of infrared emission from the near electromagnetic field that is emitted from the heated processor chip or the RAM memory under operating conditions.

An advantage of the rectennas' antenna arrangements used in the invention is that they possess uniform characteristics of receiving infrared emission in the plane of the emitting surface, while comprising also a specific nanoantenna arrangement for receiving in a direction perpendicular to the surface. This is a specific antenna arrangement designed to receive energy from the highly gradient, near chaotic electromagnetic field as efficiently as possible.

Another advantage of the rectennas according to the invention is that they comprise a resonant chamber, which geometrical parameters can be adapted for maximum efficient resonant absorption of energy from intense spectral emission lines of the near chaotic electromagnetic field created in the device under the operating temperatures of the processor or the RAM memory, whereby this energy will be used to generate an electric current.

Another advantage is that the rectenna arrangement disclosed comprises a necessary and sufficiently large class of different possible arrangements that can be used to optimize the rectenna array. Optimization can be carried out within a general concept of creating nanotechnology-based metasurfaces, which will be capable of absorbing energy from the near infrared chaotic electromagnetic field as efficiently as possible and of converting it into electrical power and electrical current generated thereby.

The circuitry in the invention provides for an integrated power management circuit for the supply current. It comprises a +V input for DC power supply to the base processor chip or the RAM memory and a second input, which is electrically connected to the DC outputs of the arrays of rectenna photodetectors of infrared emission. The second input is also connected within the integrated circuit to an input buffer integrated capacitor C1 and to the input of an integrated circuit of a DC-DC converter, possibly with the feet being brought out to the outer housing of the chip for several external elements—inductance and a Schottky diode. The output of the DC-DC converter is electrically connected to one input of a circuit of an integrated software-controlled switch comprising two powerful field-effect transistors and logic buffer elements, the circuit being of the SPDT (Single Pole Double Throw Switch) type, whereby the second input of this controlled switch is actually the DC power input of the base chip. The output of the controlled switch is electrically connected to an output buffer integrated capacitor C2 and to the power supply foot of the base processor chip or the RAM chip. Also, the integrated power management circuitry of the supply current comprises the circuitry of a dedicated control microcontroller having a dedicated logic pin electrically connected to the logic input for switching the controlled switch.

An advantage of the power management circuitry of the supply current is that it is universal for any type of a cooled chip—of the processor type, RAM memory, or even some other types of chips with high heat dissipation. The power management circuitry of the supply current comprises its own control microcontroller, completely independent of the chip cooled. A single start-up period of constant power supply to the cooled chip can be programmed using its firmware, the latter being powered from the +V input of the DC power supply, until it reaches the operating temperature. Then the integrated power management circuit of the supply current switches to regulation mode. For example, within a constant repeated period of one thousandth of a second, one power supply period is modulated by the +V input and another period is modulated when the power supply is switched to receiving power from the arrays of rectenna photodetectors of infrared emission. In other words, the cooling system enters a time-division mode of operation of one period of powering the base chip, processor or RAM from an external power source and another period of powering the base chip by the recovered thermal energy transformed into electrical current by the rectenna arrays. Regulation is carried-out using programmable pulse-width modulation of the control signal fed to the software-controlled switch, which source is the control microcontroller. This modulation of the control signal can be programmed fixedly—for a specific cooled chip and specific circuitry of the rectenna array. It can also be programmed adaptively, if the microcontroller monitors the changes within short periods of time, such as microseconds of voltage changes, which can be measured at the output of the arrays of rectenna photodetectors of infrared emission and at the input of the DC-DC converter. During the period of power consumption from the rectenna arrays as a source, this voltage decreases along with the electrical charge accumulated over the buffer capacitor C1, which is connected at this measurement point and vice versa—the voltage increases during the period of consumption from the external power source, when additional charge is accumulated over the buffer capacitor C1. The microcontroller can manage these periods of time by monitoring, via the firmware programmed therein, the voltage across the buffer capacitor C1, which shall always be within the input operating parameters of the integrated DC-DC converter. The other buffer capacitor C2 in the circuitry of the integrated power management circuit also acts as a stabilizer and maintains the output operating voltage that is supplied for powering the base processor chip or the RAM chip within the short transient switching processes of the software-controlled switch.

DETAILED DESCRIPTION OF THE INVENTION

Figure 1:
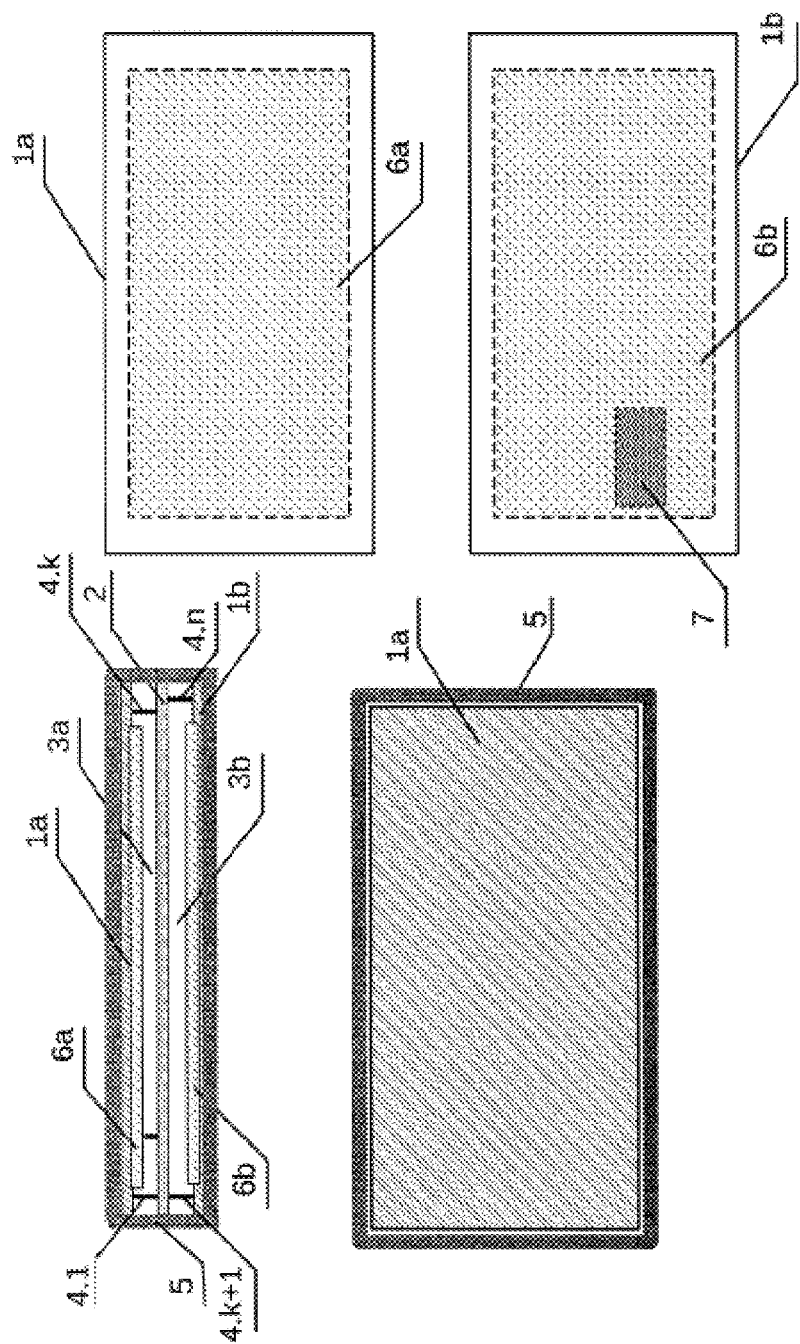
FIG. 1 is a general assembly drawing of a nanoelectronic cooling system for processors and RAM memories.

A nanoelectronic system for cooling processors and RAM memories (FIG. 1) comprises two cooling chips 1a and 1b, which are located at a distance between 20 nanometres and 200 nanometres relative to both wide-area surfaces of a processor or RAM chip 2. The spaces between the three individual chips 1a, 1b and 2 are two vacuum slots 3a and 3b. The distance between said chips is maintained by point columns 4.1 . . . 4.k, 4.k+1 . . . 4.n. The columns are made using a photolithography technique with the minimum size allowable for the technology—between 5 nm and 10 nm, and are moulded on the surfaces of both cooling chips 1a, 1b. The whole system of chips 1a, 1b and 2 thus described is hermetically encapsulated by a common outer housing 5. The cooling chips 1a and 1b comprise on their surface areas facing said main functional chip 2, respectively, arrays of rectenna photodetectors 6a and 6b of infrared emission. One of the two cooling chips 1a or 1b has also an integrated circuit 7 on its surface for power management of the supply current flowing to said base functional chip 2.

Figure 2:
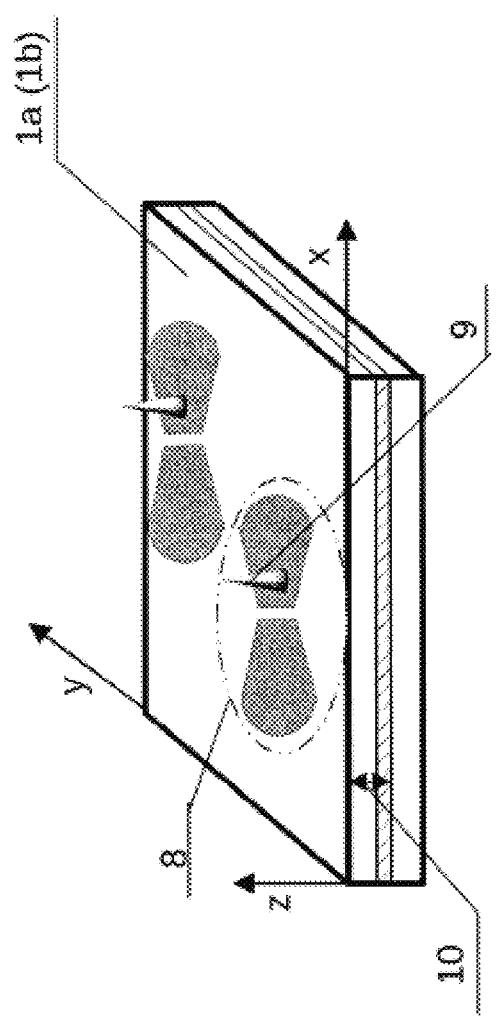
FIG. 2 is an illustrative drawing of the geometry of one rectenna from the array of rectenna photodetectors dedicated for a nanoelectronic cooling system.

Each rectenna (FIG. 2) of said arrays of rectenna photodetectors 6a and 6b of infrared emission has an antenna arrangement 8 for receiving the infrared emission with emission polarization in the plane of said chips 1a or 1b and is with a uniform reception diagram along both axes x, y in the plane. The rectenna also has at least one nanoantenna blade 9, or such an antenna system of a plurality of nanoantenna blades, which is arranged in said vacuum slot 3a or 3b for receiving infrared emission along the z-axis from the gradient chaotic electromagnetic field. Also, the volume of said respective cooling chips 1a or 1b comprises a resonant chamber 10 formed technologically, which geometry is setup at the maximum value in the spectrum of infrared emission from the near electromagnetic field that is emitted from the heated processor chip (2) under operating conditions.

Figure 3:
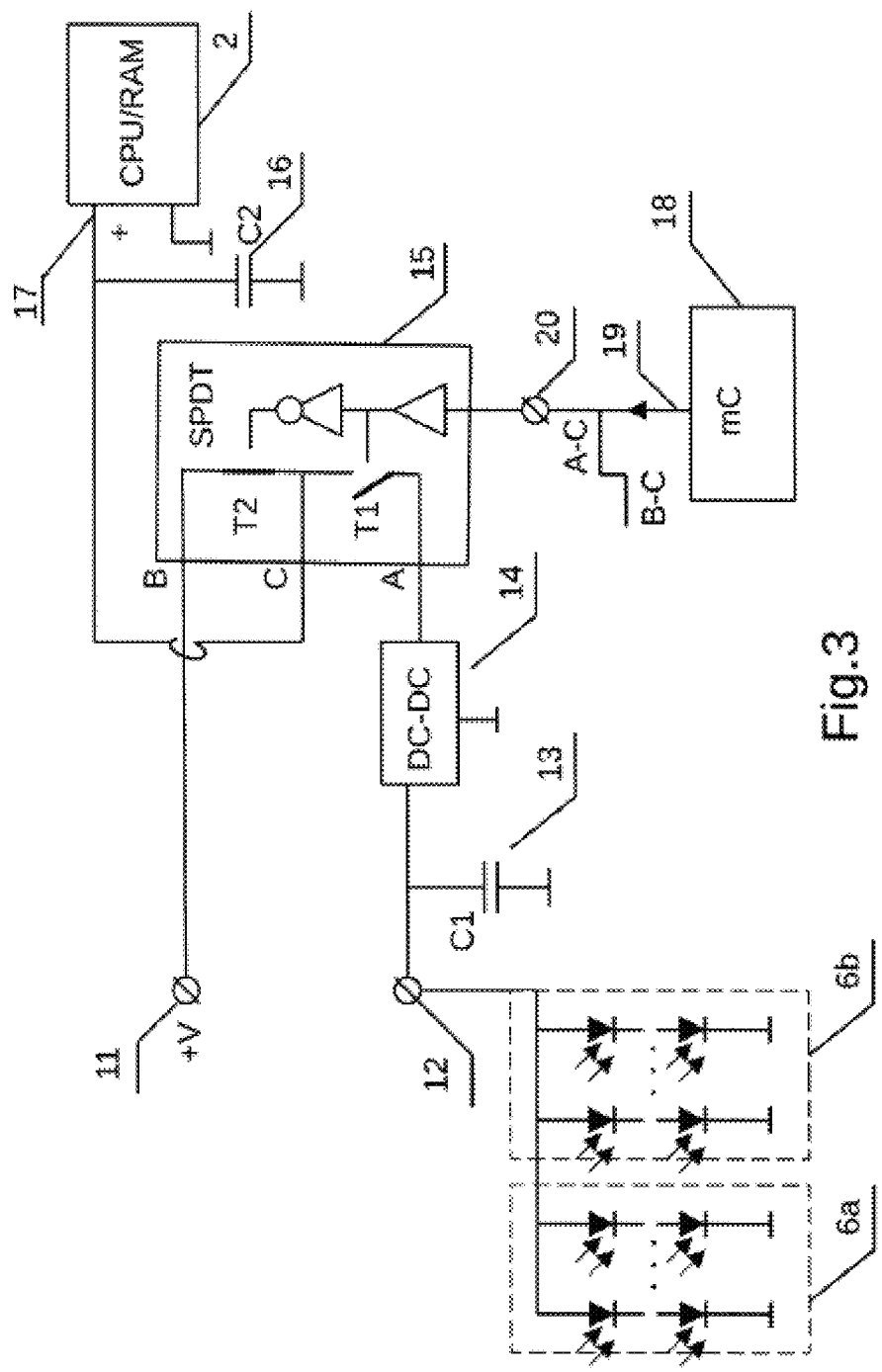
FIG. 3 is a flow-chart of the integrated electronic circuit for power management of the supply current of processors and RAM memories within one nanoelectronic system for cooling thereof.
Figure 4:
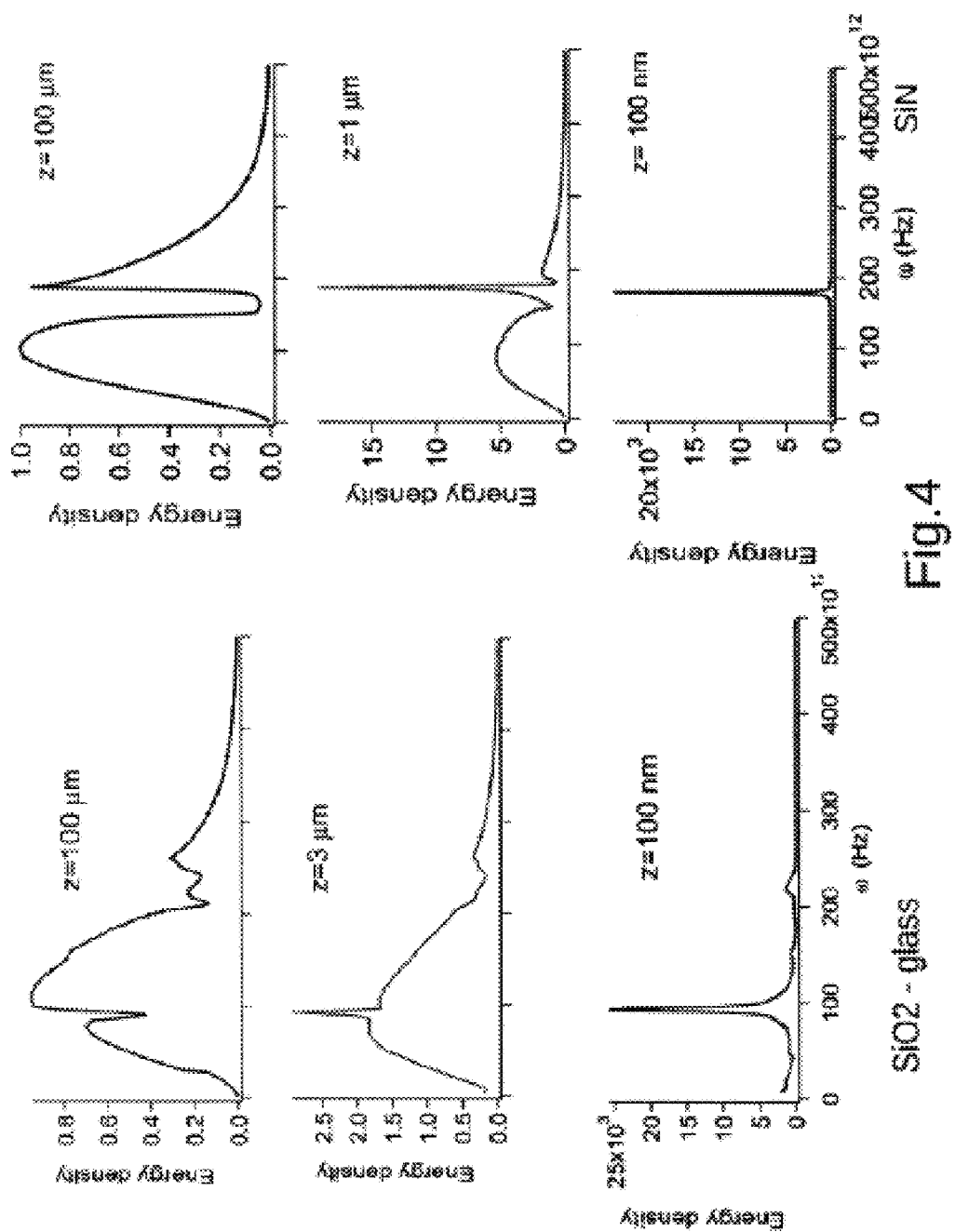
FIG. 4 shows graphs of the emission spectrum of the near chaotic electromagnetic field for two materials—glass and SiN at a room temperature, as an illustration of the properties of this type of electromagnetic fields.

The flow-chart (FIG. 3) of one integrated electronic circuit 7 for power management of the supply current for processors and RAM memories within a nanoelectronic system for cooling thereof comprises the following elements and connections . . . . It comprises an input 11, designated for an input voltage of +V for DC power supply of the base processor chip or the RAM memory 2. It comprises also a second input 12, which is electrically connected to the DC outputs of said arrays of rectenna photodetectors 6a and 6b of infrared emission and is also connected to an input buffer capacitor 13, designated also as C1. The second input 12 is also connected to the input of an integrated circuit of a DC-DC converter 14, whereby the feet are possibly brought out to the outer housing of the chip for several external elements—inductance and a Schottky diode. The output of the DC-DC converter 14 is connected to one input of a circuit of an integrated software-controlled switch (15) comprising two powerful field-effect transistors and logic buffer elements, said circuit being of the SPDT (Single Pole Double Throw Switch) type. The second input of this controlled switch 15 is actually the DC power input 11 of said base chip 2. The output of the controlled switch 15 is electrically connected to an output buffer integrated capacitor 16, designated as C2, and is also connected to a power supply foot 17 of said cooled processor chip or RAM chip 2. Also, the integrated power management circuitry 7 of the supply current comprises the circuitry of a control microcontroller 18 having a dedicated logic pin 19, which is electrically connected to a logic input 20 for switching said controlled switch 15.

REFERENCES

/1/ WO2001090866 A2
/2/ U.S. Pat. No. 6,598,666B2
/3/ Surface Electromagnetic Waves Thermally Excited: Radiative Heat Transfer, Coherence Properties and Casimir Forces Revisited in the Near Field, Karl Joulain, Jean-Philippe Mulet, Francois Marquier, R'emi Carminati, Jean-Jacques Greffet, Surface Science Reports; Volume 57, Issues 3-4, May 2005, Pages 59-112, arXiv: physics/0504068v2.
/4/ BG/P/2020/113245

The invention claimed is:

1. A nanoelectronic system for cooling processors and RAM memories, characterized in that it comprises two cooling chips (1*a*) and (1*b*), which are located at a distance between 20 nanometres and 200 nanometres relative to both wide-area surfaces of a processor or RAM chip (2), whereby the spaces between the individual chips (1*a*), (1*b*) and (2) are two vacuum slots (3*a*), (3*b*), and the distance between said chips is maintained by point columns (4•1 . . . 4•*k*, 4•*k*+1 . . . 4⊇n), which are made using a photolithography technique with the minimum size allowable for the technology—between 5 nm and 10 nm, and are moulded on the surfaces of both cooling chips (1*a*), (1*b*), whereby the whole system of chips (1*a*), (1*b*) and (2) thus described is hermetically encapsulated by a common outer housing (5); the cooling chips (1*a*) and (1*b*) comprise on their surface areas facing said main functional chip (2)—respectively, arrays of rectenna photodetectors (6*a*) and (6*b*) of infrared emission, and also, one of the two cooling chips (1*a*) or (1*b*) has an integrated circuit (7) on its surface for power management of the supply current flowing to said base functional chip (2).

2. Arrays of rectenna photodetectors (6*a*), (6*b*) of infrared emission, according to claim 1, characterized in that each rectenna from said arrays has both an antenna arrangement (8) for receiving the infrared emission with emission polarization in the plane of said chips (1*a*) or (1*b*) and is with a uniform reception diagram along both axes x, y in the plane, and at least one nanoantenna blade (9), or such an antenna system of a plurality of nanoantenna blades, which is arranged in said vacuum slot (3*a*) or (3*b*) for receiving infrared emission along the z-axis from the gradient chaotic electromagnetic field, which propagates in the form of surface electromagnetic waves in the relevant vacuum slot (3*a*), (3*b*), whereby the volume of the respective chip (1*a*) or (1*b*) comprises a resonant chamber (10) formed technologically, which geometry is setup at the maximum value in the spectrum of infrared emission from the near electromagnetic field that is emitted from said heated processor chip (2) or RAM memory under operating conditions.

3. An integrated circuit (7) for power management of the supply current, according to claim 1, characterized in that it comprises an input+V (11) for DC power supply of the base processor chip or the RAM memory (2), and an input (12), which is electrically connected to the DC outputs of said arrays of rectenna photodetectors (6*a*) and (6*b*) of infrared emission and is also connected, within the integrated circuit (7), to an input buffer integrated capacitor C1 (13) and to the input of an integrated circuit of a DC-DC converter (14), where the feet are possibly brought out to the outer housing of the chip for several external elements—inductance and a Schottky diode, whereby the output of the DC-DC converter (14) is connected to one input of a circuit of an integrated software-controlled switch (15) comprising two powerful field-effect transistors and logic buffer elements, said circuit being of the SPDT (Single Pole Double Throw Switch) type; the second input of this controlled switch (15) is actually the DC power input (11) of said base chip (2), and the output of the controlled switch (15) is electrically connected to an output buffer integrated capacitor C2 (16) and to a power supply foot (17) of said base processor chip or RAM chip (2), wherein the integrated power management circuitry (7) of the supply current comprises the circuitry of a dedicated control microcontroller (18) having a dedicated logic pin (19), which is electrically connected to a logic input (20) for switching said controlled switch (15).

* * * * *